(12) United States Patent  (10) Patent No.: US 7,109,528 B2
Nakata                     (45) Date of Patent:    Sep. 19, 2006

(54) LIGHT RECEIVING OR EMITTING SEMICONDUCTOR APPARATUS

(76) Inventor: Josuke Nakata, 29-3, Goryooneyama-cho, 4-chome Nishikyo-ku, Kyoto-shi, Kyoto, 610-1102 (JP)

( * ) Notice: Subject to any disclaimer, the term of this patent is extended or adjusted under 35 U.S.C. 154(b) by 69 days.

(21) Appl. No.: 10/497,324

(22) PCT Filed: Dec. 25, 2001

(86) PCT No.: PCT/JP01/11416

§ 371 (c)(1), (2), (4) Date: Jun. 21, 2004

(87) PCT Pub. No.: WO03/056633

PCT Pub. Date: Jul. 10, 2003

(65) Prior Publication Data

US 2005/0121683 A1    Jun. 9, 2005

(51) Int. Cl.
    *H01L 33/00* (2006.01)
(52) U.S. Cl. .................. 257/99; 257/44; 257/51; 257/100; 257/104; 257/433; 257/461
(58) Field of Classification Search ............ 257/99, 257/100, 433, 459, 461, 466, 104, 44, 51
    See application file for complete search history.

(56) References Cited

U.S. PATENT DOCUMENTS

| 3,998,659 | A |   | 12/1976 | Wakefield |
| 4,126,812 | A | * | 11/1978 | Wakefield ............... 313/500 |
| 4,582,588 | A |   | 4/1986  | Jensen et al. |
| 5,419,782 | A | * | 5/1995  | Levine et al. .............. 136/246 |
| 5,469,020 | A |   | 11/1995 | Herrick |
| 6,204,545 | B1 |  | 3/2001  | Nakata |
| 6,265,242 | B1 | * | 7/2001 | Komori et al. ............... 438/66 |
| 6,294,822 | B1 |  | 9/2001  | Nakata |
| 6,355,873 | B1 | * | 3/2002 | Ishikawa .................. 136/250 |

FOREIGN PATENT DOCUMENTS

JP    2000-22184    1/2000

(Continued)

*Primary Examiner*—Minhloan Tran
*Assistant Examiner*—Tan Tran
(74) *Attorney, Agent, or Firm*—Jordan and Hamburg LLP

(57) ABSTRACT

With a solar ball 10 serving as a light-receiving semiconductor apparatus, the outer surface of a spherical solar cell 1 is covered with a light-transmitting outer shell member 11, and electrode members 14, 15 are connected to electrodes 6, 7 of the solar cell 1. The outer shell member 11 comprises a capsule 12 produced by bonding together two halves, and a filler 13 that is packed inside this capsule and cured. A solar panel can be configured such that a plurality of the solar balls 10 are arrayed in a matrix and connected in parallel and in series, or a solar panel can be configured such that a multiplicity of spherical solar cells 1 are arrayed in a matrix and covered with a transparent outer shell member. A solar string in the form of a rod or cord can be configured such that a plurality of the solar cells 1 are arrayed in columns and connected in parallel, and then covered with a transparent outer shell member. Since the outer shell member 11 condenses light, the light-receiving area of the solar cell 1 can be expanded. Also discussed is a light-emitting semiconductor apparatus in which a spherical semiconductor device with a light-emitting function, rather than the solar cell 1, is covered with an outer shell member.

11 Claims, 8 Drawing Sheets

FOREIGN PATENT DOCUMENTS

| JP | 2001-168369 | 6/2001 |
| JP | 2001-210843 | 8/2001 |
| WO | 98/15983 | 4/1998 |
| WO | 99/10935 | 3/1999 |

* cited by examiner

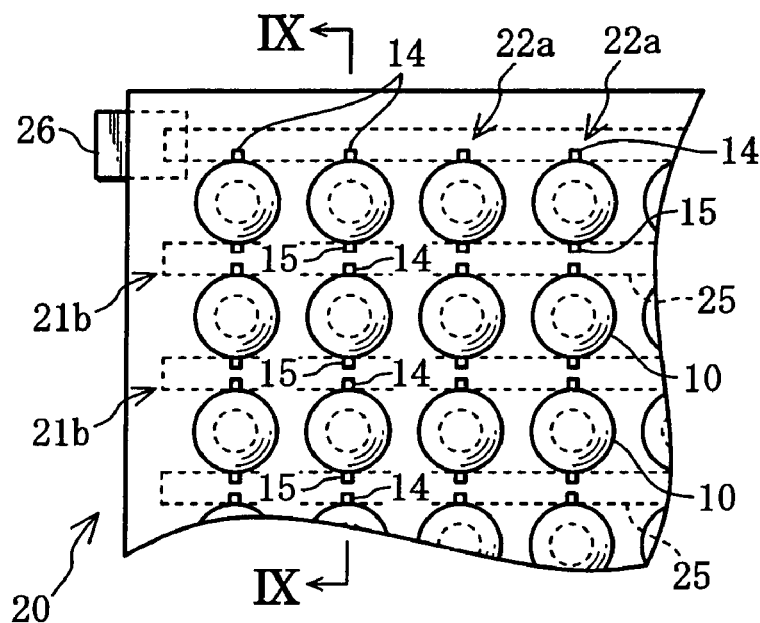
Fig. 8
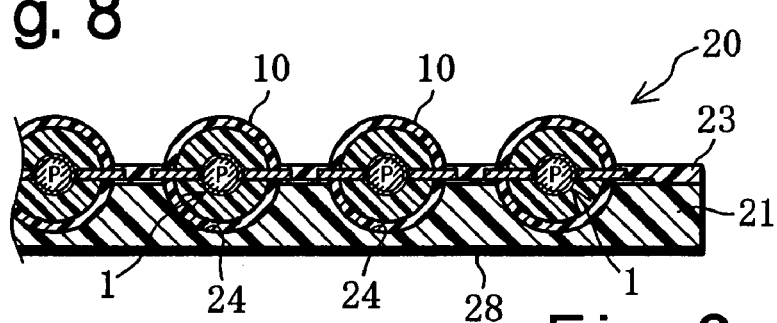
Fig. 9
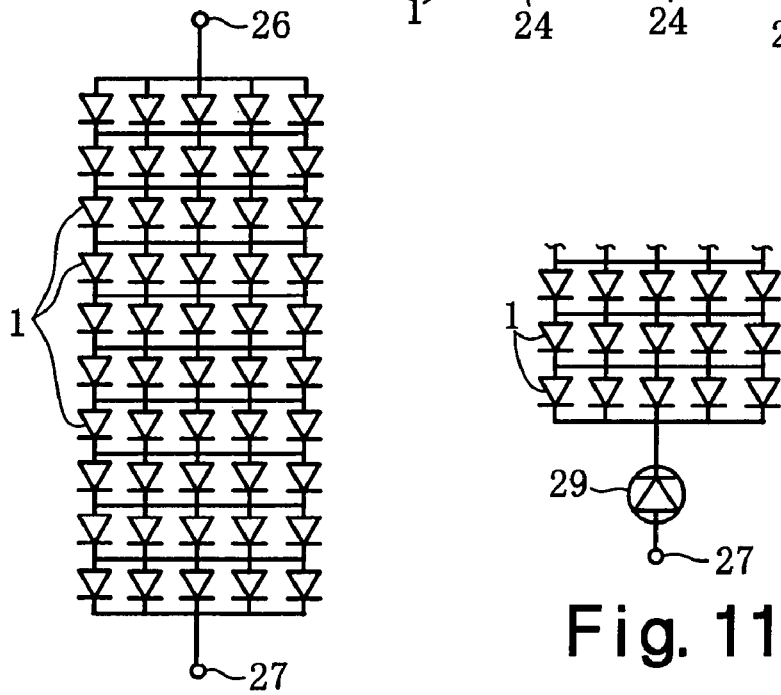
Fig. 10
Fig. 11

LIGHT RECEIVING OR EMITTING SEMICONDUCTOR APPARATUS

TECHNICAL FIELD

The present invention relates to a light-receiving or light-emitting semiconductor apparatus, and more particularly relates to an apparatus in which the outside of a spherical semiconductor device with a light-receiving or light-emitting function is covered with a light-transmitting outer shell member so as to improve the light condensation performance or light radiation performance. This can be used in various applications such as solar cells, lighting devices, and display devices.

BACKGROUND OF THE INVENTION

Conventionally, research has been directed toward a technology forming a pn junction via a diffusion layer on the surface of a small-diameter spherical semiconductor element composed of a p or n type semiconductor, connecting many of these spherical semiconductor elements in parallel to a common electrode, and putting to practical use for a solar cell or semiconductor photocatalyst.

U.S. Pat. No. 3,998,659 discloses a solar cell configured such that a p type diffusion layer is formed on the surface of an n type spherical semiconductor, the diffusion layers of many spherical semiconductors are connected to a common membrane electrode (positive electrode), and the n type cores of many spherical semiconductors are connected to a common membrane electrode (negative electrode).

U.S. Pat. No. 4,021,323 discloses a solar energy converter (semiconductor module) in which p type spherical semiconductor elements and n type spherical semiconductor elements are disposed in series, these semiconductors are connected to a common film-like electrode, and the diffusion layers of these semiconductor elements are brought into contact with a common electrode in the electrolyte, so that the electrolyte will undergo electrolysis when irradiated with sunlight.

With the modules featuring spherical cells disclosed in U.S. Pat. Nos. 4,582,588 and 5,469,020, each spherical cell is attached by being connected to a common sheet-like electrode, so this configuration is suitable for the parallel connection of a plurality of cells, but not for the serial connection.

Meanwhile, as discussed in U.S. Pat. Nos. 6,204,545 and 6,294,822, the inventor of the present invention has proposed a granular light-receiving or light-emitting semiconductor device in which a diffusion layer, a pn junction, and a pair of electrodes are formed on spherical semiconductor elements composed of p type or n type semiconductor, and in U.S. Pat. No. 6,204,545 the inventor has proposed a semiconductor module that is applicable to solar cells, photocatalyst apparatuses used in the electrolysis of water, a variety of light emitting devices, and color displays, and so forth. With this semiconductor module, if any of the semiconductor device in any of the serial connection becomes open through malfunction, current stops flowing to the serial circuit including that semiconductor element, the remaining properly-functioning semiconductor devices in the serial connection also cease functioning, and the output of the semiconductor module decreases.

In view of this, the inventors have come up with a serial/parallel connection structure in which a plurality of semiconductor cells are disposed in a matrix, the semiconductor cells in each column are connected in series, and the semiconductor cells in each row are connected in parallel, and have filed several international patent applications.

However, the semiconductor module in U.S. Pat. No. 6,204,545 employs a structure in which the electrodes of the semiconductor cells are connected so that a plurality of semiconductor cells are connected in series, and these serial connections are arrayed in a plurality of planar rows, and the pair of electrodes of each semiconductor cell is extremely small, so when the above-mentioned serial/parallel connection structure is employed, manufacture becomes complicated, it is difficult to produce a large semiconductor module, and the cost of manufacturing a semiconductor module rises.

As discussed above, the spherical semiconductor device proposed by the inventor has a small diameter of only about 1 to 3 mm, so when it is applied in a solar panel or light emitting panel, for instance, a large number of these spherical semiconductor devices end up being disposed just a few millimeters apart in a matrix. Because so many of the spherical semiconductor devices are required in this case, manufacturing expense become higher. With a solar panel, it is possible to reduce the number of spherical semiconductor devices needed by additionally providing the spherical semiconductor devices in each column with a cylindrical condensing lens, so that the spacing between columns is increased. However, the position and orientation of the condensing lens must be varied according to the incident direction of the sunlight, and also a complex and expensive mechanism is needed to movably support and control the orientation of the condensing lens, so this situation is impractical.

Meanwhile, in the case of a light emitting panel used for lighting or display, the light emitted from the small-diameter spherical semiconductor device tends to be excessively bright, and it is difficult to construct a light emitting panel that emits soft light of the proper brightness.

The object of the present invention is to provide a light-receiving semiconductor apparatus with improved condensing function that condenses light in a light-receiving spherical semiconductor device; a light-receiving semiconductor apparatus with improved condensing function and which is less apt to be affected by the malfunction of some of the spherical semiconductor devices when a plurality of spherical semiconductor device are disposed in a plurality of rows and a plurality of columns; a light-receiving semiconductor apparatus with improved condensing function and in which a plurality of spherical semiconductor devices disposed in one or more columns are connected in parallel in each column unit; and a light-emitting semiconductor apparatus with improved light diffusion function that diffuses the light emitted from a light-emitting spherical semiconductor device.

DISCLOSURE OF THE INVENTION

The light-receiving or light-emitting semiconductor apparatus according to the present invention comprises at least one spherical semiconductor device with a light-receiving function or a light-emitting function, wherein the spherical semiconductor device comprises a p or n type semiconductor crystal with a spherical outer shape, a pn junction formed substantially spherically on the surface layer portion of the semiconductor crystal, and a pair of electrodes connected to both ends of the pn junction and located on either side with interposing the center of curvature of the pn junction therebetween, and there is provided an outer shell member constituted so as to cover an outside of the spherical semiconductor device with a light-transmitting wall component whose thickness is at least ¼ the diameter of the spherical semiconductor device, and so that the outer surface of this outer shell member forms a sphere or partial sphere.

When this semiconductor apparatus is a light-receiving semiconductor apparatus, external light is incident on the outer surface of the outer shell member, most of this incident light is refracted at the surface and enters the interior of the outer shell member, eventually reaching the spherical semiconductor device and generating photovoltaic power. Since the outer surface of the outer shell member is spherical or partially spherical, the incident light reaches the spherical semiconductor device and generates photovoltaic power even if the direction of incidence varies.

Because the outer shell member covers the outside of the spherical semiconductor device with a light-transmitting wall component whose thickness is at least ¼ the diameter of the spherical semiconductor device, the outer shell member exhibits a condensing function, there is an increase in the light-receiving surface area per spherical semiconductor device, and more light reaches each spherical semiconductor device.

When this semiconductor apparatus is a light-emitting semiconductor apparatus, the light generated from the substantially spherical pn junction is radiated in substantially all directions, and is radiated to the outside from the spherical or partial-spherical outer surface of the outer shell member. Because the outer shell member covers the outside of the spherical semiconductor device with a light-transmitting wall component whose thickness is at least ¼ the diameter of the spherical semiconductor device, the outer shell member exhibits a light diffusion function, the size of the light emission source is increased, the brightness of the light radiated from the emission source is lessened, and a softer light is radiated to the outside.

The following constitutions can also be employed as desired.

(a) The outer surface of the outer shell member comprises a spherical light-transmitting capsule forming the outer surface portion of the outer shell member, and a filler composed of a light-transmitting synthetic resin that is packed into this capsule and cured.

(b) Multiplicity of microscopic light scattering surfaces are formed on the outer surface of the outer shell member.

(c) There is provided a pair of electrode members respectively connected to the pair of electrodes of the spherical semiconductor device and extending through the outer shell member at least to the outer surface of the outer shell member.

(d) A plurality of spherical semiconductor devices, each having an outer surface covered with the outer shell member that forms a sphere, are arrayed in a matrix of a plurality of rows and a plurality of columns, and there are provided a serial connection mechanism for electrically connecting in series the plurality of spherical semiconductor devices in each row or column, and a parallel connection mechanism for electrically connecting in parallel the plurality of spherical semiconductor devices in each column or row.

(e) A plurality of spherical semiconductor devices are arrayed in a matrix of a plurality of rows and a plurality of columns, there is provided a conduction connection mechanism for electrically connecting in parallel the plurality of spherical semiconductor devices in each row or column, and the outer shell member comprises a plurality of substantially spherical outer shell components covering each of the plurality of spherical semiconductor devices, and a flat component formed integrally with the plurality of outer shell components.

(f) The conduction connection mechanism comprises a plurality of conductor wires, which are part of a network structure constituted by the plurality of conductor wires and a plurality of insulator wires laid out perpendicularly to these conductor wires.

(g) Another light-receiving or light-emitting semiconductor apparatus of the present invention comprises a plurality of spherical semiconductor devices with a light-receiving function or a light-emitting function, wherein each of the spherical semiconductor devices comprises a p or n type semiconductor crystal with a spherical outer shape, a pn junction formed substantially spherically on the surface layer portion of the semiconductor crystal, and a pair of electrodes connected to both ends of the pn junction and located on either side with interposing the center of curvature of the pn junction therebetween, there is provided a conduction connection mechanism for electrically connecting in parallel the plurality of spherical semiconductor devices, with the plurality of spherical semiconductor devices being disposed in a single column, and there is provided an outer shell member that covers an outside of the plurality of spherical semiconductor devices with a light-transmitting wall component whose thickness is at least ¼ the diameter of the spherical semiconductor devices, and that has a cylindrical outer surface.

(h) Still another light-receiving or light-emitting semiconductor apparatus comprises a plurality of spherical semiconductor devices with a light-receiving function or a light-emitting function, wherein each of the spherical semiconductor devices comprises a p or n type semiconductor crystal with a spherical outer shape, a pn junction formed substantially spherically on the surface layer portion of the semiconductor crystal, and a pair of electrodes connected to both ends of the pn junction and located on either side with interposing the center of curvature of the pn junction therebetween, a plurality of spherical semiconductor devices are disposed in a plurality of columns, there is provided a conduction connection mechanism for electrically connecting in parallel a plurality of spherical semiconductor devices of each of these columns in column units, and there is provided a outer shell member that covers in common the outside of the plurality of spherical semiconductor devices with a light-transmitting wall component whose thickness is at least approximately equal to the diameter of the spherical semiconductor devices, and that has a plurality of cylinders of substantially cylindrical shape that cover each of the plurality of columns of spherical semiconductor devices.

(i) The spherical semiconductor devices have a photovoltaic power generator that includes the pn junction.

(j) The spherical semiconductor devices have an electro-optical converter that includes the pn junction.

BRIEF DESCRIPTION OF THE DRAWINGS

The drawings illustrate embodiments of the present invention.

FIG. 8 is a detail enlarged plan view of a solar panel in which the solar balls of FIG. 2 have been arrayed in a plurality of rows and a plurality of columns;

FIG. 9 is an enlarged cross section along the IX—IX line in FIG. 8;

FIG. 10 is a circuit diagram of an equivalent circuit of the solar panel of FIG. 8;

FIG. 11 is an equivalent circuit partial diagram in which part of the equivalent circuit in FIG. 10 has been changed;

PREFERRED EMBODIMENT OF THE INVENTION

The most preferable embodiment of the present the invention will now be described through reference to the drawings.

First, descriptions will be made on a spherical solar cell 1 incorporated into a solar panel, which serves as a light-receiving semiconductor apparatus. This solar cell 1 corresponds to a spherical semiconductor device.

Figure 1:
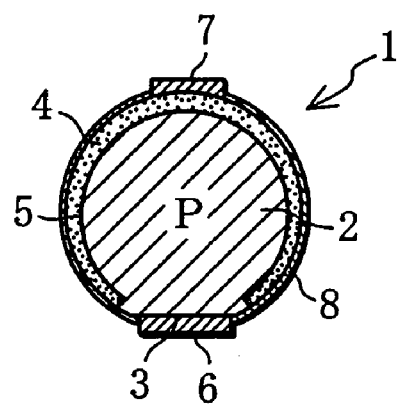
FIG. 1 is an enlarged cross section of a spherical semiconductor device.

FIG. 1 shows an enlarged cross section of a spherical solar cell 1. This solar cell 1 is made from a spherical crystal 2 with a diameter of approximately 0.6 to 2.0 mm, composed of a p type silicon monocrystal with a resistivity of about 1 Ωm. A flat surface 3 with a diameter of approximately 0.6 mm is formed at the bottom of this spherical crystal 2. On the surface portion of this spherical crystal 2 formed is an n+ type diffusion layer 4 (approximately 0.4 to 0.5 μm thick) in which phosphorus (P) has been diffused, and a pn junction 5 that is substantially spherical in shape. The 0.6 mm diameter of the flat surface 3 is the size when the spherical crystal 2 has a diameter of 2.0 mm.

A pair of electrodes 6, 7 (positive electrode 6 and negative electrode 7) are provided at the two ends, with interposing the center of the spherical crystal 2 (the center of curvature of the pn junction 5) therebetween. The positive electrode 6 is disposed on the flat surface 3 and is connected to the spherical crystal 2, while the negative electrode 7 is connected to the n+ type diffusion layer 4. The entire surface other than the positive electrode 6 and the negative electrode 7 is covered with an antireflective film 8 (approximately 0.6 to 0.7 μm thick) composed of a SiO2 or TiO2 insulating film. The positive electrode 6 is formed by baking an aluminum paste, for example, and the negative electrode 7 is formed by baking a silver paste.

A solar cell 1 such as this can be produced by first producing the spherical crystal 2 by the method proposed by the inventor in U.S. Pat. No. 6,204,545, and then forming the flat surface 3, the n+ type diffusion layer 4, the pair of electrodes 6, 7, and the antireflective film 8. When the spherical crystal 2 is produced, a dropping tube with a height of approximately 14 m is employed, grains of p type silicon (the raw material) are heated and melted inside the upper end of the dropping tube, and the material falls freely and solidifies while maintained in a true spherical shape by the action of surface tension, thereby producing the spherical crystals 2 in the form of substantially true spheres. The spherical crystals 2 need not be formed with a dropping tube, and may instead be formed into spherical or substantially spherical crystals by mechanical grinding or another such method.

The flat surface 3 can be formed by mechanically grinding part of the spherical crystal 2. Forming this flat surface 3 makes the spherical crystal 2 less prone to rolling, allows it to be chucked with a vacuum chuck, and allows the positive electrode 6 to be distinguished from the negative electrode 7. Next, when the n+ type diffusion layer 4 is formed, the flat surface 3 of the spherical crystal 2 and the portion around the outer periphery of this flat are masked with SiO2, and phosphorus (P) is diffused as a n type impurity into the surface of the spherical crystal 2 by a known method or the method disclosed in the above-mentioned publication. The pair of electrodes 6, 7 and the antireflective film 8 can also be formed by a known method or the method disclosed in the above-mentioned publication. This solar cell 1 has an photoelectric conversion function, and generates a photovoltaic power of 0.5 to 0.6 V when irradiated with sunlight.

Next, descriptions will be made on the solar ball 10, as a semiconductor apparatus structured such that the outside of the above-mentioned solar cell 1 is covered with the light-transmitting outer shell member 11.

Figure 2:
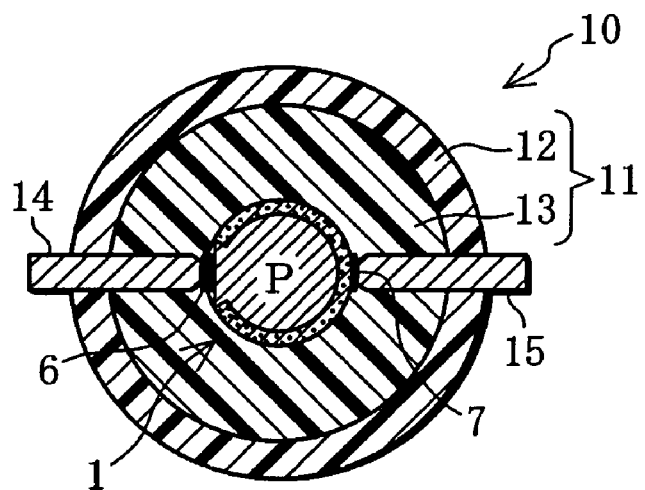
FIG. 2 is an enlarged cross section of a solar ball.
Figure 3:
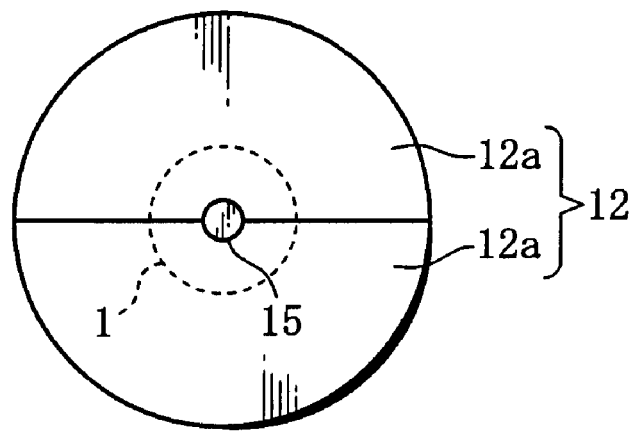
FIG. 3 is an enlarged side view of the solar ball in FIG. 2.

FIG. 2 shows an enlarged cross section of the solar ball 10. This solar ball 10 comprises the solar cell 1 located in the center, the light-transmitting outer shell member 11 that covers the outside of this solar cell 1 with a light-transmitting wall component whose thickness is at least ¼ the diameter of the solar cell 1, and a pair of electrode members 14, 15. This outer shell member 11 serves to increase the amount of light introduced into the solar cell 1, and comprises a capsule 12 in the form of a light-transmitting spherical shell, and a light-transmitting filler 13 that fills this capsule 12.

The capsule 12 is made of a transparent, insulating synthetic resin (such as a polycarbonate, acrylic, polyarylate, methacrylic, silicone, or polyester) or transparent glass, and is 0.2 to 1.0 mm in thickness, for example. In order for the interior of the capsule 12 to accommodate the solar cell 1, the capsule 12 is formed as a spherical capsule by bonding together a pair of hemispherical capsule segments 12a.

Figure 4:
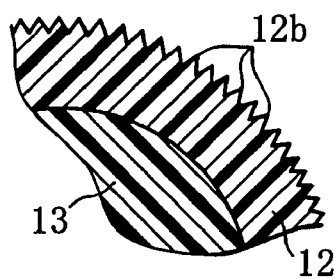
FIG. 4 is a detail enlarged cross section of the outer shell member.

In order for as much as possible of the light incident on this capsule 12 from the outside to be guided into the capsule 12, a multiplicity of microscopic irregularities 12b in the form of pointed pyramids as shown in FIG. 4 are formed on the outer surface of the capsule 12 as light scattering surfaces. These microscopic irregularities 12b may be pointed pyramids as shown in the drawing, or may consist of convex curved surfaces with a small radius of curvature.

The filler 13 is provided by filling the inside of the capsule 12 with a transparent, insulating synthetic resin (such as a filler whose main component is a methacrylic resin or a silicone resin) in the form of a liquid, and then curing the filler by heating or UV irradiation. The thickness of the light-transmitting wall component of the outer shell member 11 (the thickness from the surface of the capsule 12 to the solar cell 1) is preferably at least ¼ the diameter of the solar cell 1. If the thickness of the light-transmitting wall component is less than ¼ the above-mentioned diameter, almost no function of increasing the quantity of light will be obtained. If the light-transmitting wall component of the outer shell member 11 is too thick, however, there will be a greater portion that does not contribute to increase the amount of light guided to the solar cell 1, so the thickness of the light-transmitting wall component of the outer shell member 11 is preferably about ¼ to 5 times the diameter of the solar cell 1.

In order to reduce the reflection of light at the surface of the capsule 12, it is preferable for the refractive index of the material that makes up the capsule 12 to be as near to 1.0 as possible, and for the refractive index of the synthetic resin material that makes up the filler 13 to be as large as possible. The majority of the outer shell member 11 may be made up of a capsule having a plurality of layers, with the optical refractive index decreasing in stages from the center outward.

The pair of electrode members 14, 15 are preferably made up of a metal with excellent conductivity (such as copper, silver, or nickel). The electrode member 14 passes through a hole formed in the outer shell member 11, the distal end of the electrode member 14 is connected with solder or an electroconductive adhesive to the positive electrode 6 of the solar cell 1, and the other end of the electrode member 14 protrudes by a specific length outward from the outer surface of the capsule 12. The electrode member 15 passes through a hole formed in the outer shell member 11, the distal end of the electrode member 15 is connected with solder or an electroconductive adhesive to the negative electrode 7 of the solar cell 1, and the other end of the electrode member 15 protrudes by a specific length outward from the outer surface of the capsule 12.

When the solar ball 10 is produced, the solar cell 1, the pair of hemispherical capsule segments 12a, the pair of electrode members 14, 15, and the liquid raw material of the filler 13 are readied, the pair of electrode members 14, 15 are first attached to the spherical solar cell 1, and this solar cell 1 with its attached pair of electrode members 14, 15 is housed in the pair of hemispherical capsule segments 12a, after which the capsule segments 12a are put together to form a sphere, and the contact surfaces around the circumference are joined with an adhesive to create a spherical capsule 12.

Figure 5:
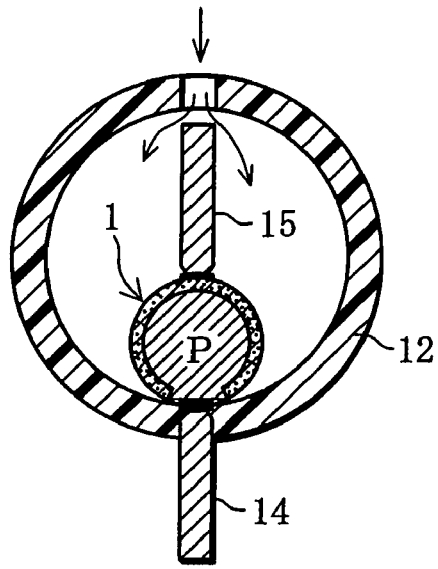
FIG. 5 is an enlarged cross section illustrating the state when the inside of a capsule has been filled with a liquid, transparent, synthetic resin.

Next, as shown in FIG. 5, the electrode member 14 is made to protrude to the outside from one of the holes in the capsule 12, the electrode member 15 is set in place away from and to the inside of the other hole in the capsule 12, and in this state the inside of the capsule 12 is filled with the liquid filler raw material as indicated by the arrows. The solar cell 1 is then positioned at the center inside the capsule 12, and UV irradiation is then performed, for example, which cures the raw material to create the filler 13.

Figure 6:
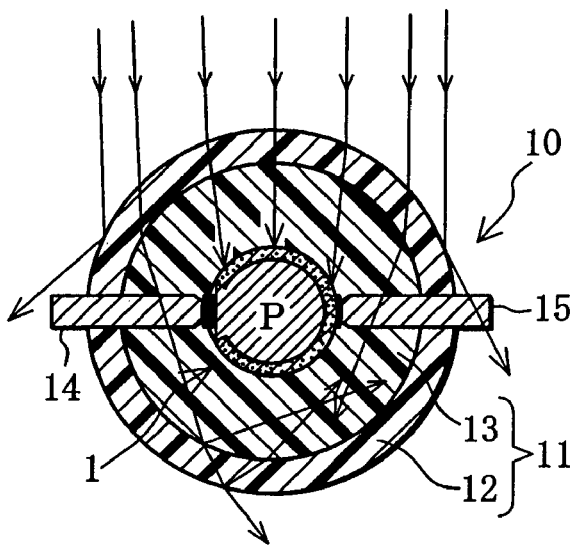
FIGS. 6, 7 are each an enlarged cross section of a solar ball, and illustrating the behavior of light during its receipt.

The action of this solar ball 10 will now be described. As shown in FIG. 6, when sunlight is incident, for instance, because the outer shell member 11 is spherical and the light incident on the outer surface thereof is guided to the center by refraction, the amount of light guided to the spherical solar cell 1 is markedly increased by the condensing action of the outer shell member 11. Furthermore, reflection at the boundary between the capsule 12 and the filler 13 creates an action whereby the light is confined in the interior, so the amount of light received by the spherical solar cell 1 is increased.

Figure 7:
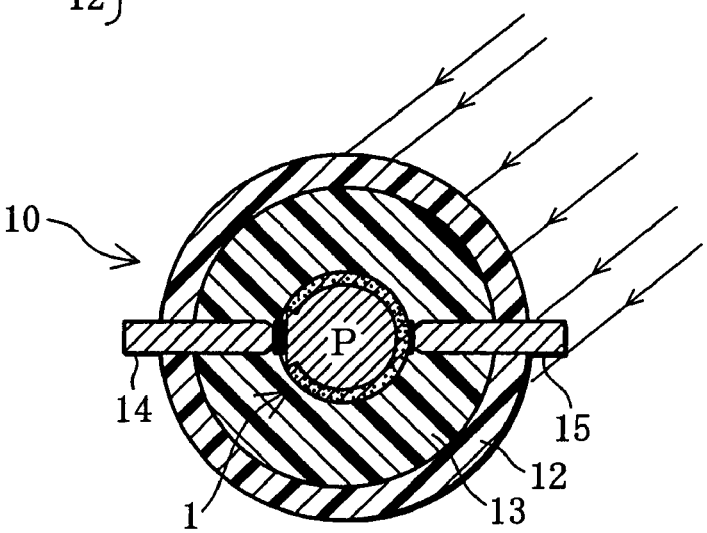

The amount of light received by the spherical solar cell 1 can be further increased by forming an antireflective film on the surface of the lower half of the capsule 12 of the solar ball 10 in FIG. 6. FIG. 7 shows the state when the sunlight is slanted to the west, but since the outer surface of the outer shell member 11 is spherical, the conditions under which the light is received are substantially the same as in FIG. 6.

Next, descriptions will be made on a solar panel 20 in which many of the solar balls 10 are incorporated. As shown in FIGS. 8 and 9, this solar panel 20 comprises a base panel 21 made of a light-transmitting, insulating, synthetic resin, a plurality of solar balls 10 disposed in a plurality of rows and a plurality of columns on this base panel 21, a serial connection mechanism 22a for the serial connection of these solar balls 10, a parallel connection mechanism 22b for the parallel connection of each row of solar balls 10, a light-transmitting, synthetic resin surface cover layer 23 that covers the top surface of the base panel 21, the serial connection mechanism 22a, and the parallel connection mechanism 22b, and so forth. The base panel 21 is made of a transparent synthetic resin (such as a polycarbonate, acrylic, polyarylate, methacrylic, silicone, or polyester) or transparent glass, having a size of 30 cm×30 cm and a thickness of 3.0 to 5.0 mm, for example. Substantially hemispherical recesses 24 for situating the solar balls 10 are formed in a matrix of a plurality of rows and a plurality of columns at a specific spacing on the top of this base panel 21. As shown in FIG. 8, the serial connection mechanism 22a and the parallel connection mechanism 22b are constituted by a plurality of strips of conductive film 25 formed parallel to the planar portion on the top of the base panel 21. These conductive film strips 25 are composed of a transparent, conductive, synthetic resin or a metal film (such as copper or nickel).

The electrode members 14, 15 of the plurality of solar balls 10 are oriented in parallel with their polarity aligned, and these solar balls 10 are mounted in the plurality of rows and plurality of columns of the recesses 24. For example, the electrode member 14 on the positive electrode 6 side faces upward in FIG. 8, the electrode member 15 on the negative electrode 7 side faces downward as viewed in FIG. 8, and the electrode members 14, 15 are connected with solder or an electroconductive adhesive to the corresponding conductive film strips 25.

In other words, the plurality of solar balls 10 in each row are connected in parallel by the conductive film strips 25 on both sides, and the plurality of solar balls 10 in each column are connected in series via a plurality of the conductive film strips 25. A positive electrode terminal 26 (external lead) composed of a thin metal sheet which is connected to the conductive film strip 25 at the end on the current output side, and a negative electrode terminal 27 (see FIG. 10) that is the same as discussed above is connected to the conductive film strip 25 on the opposite end from the conductive film strip 25 on this end on the current output side.

The surface cover layer 23, which is composed of a light-transmitting, insulating synthetic resin, is formed over the upper surface of the base panel 21, except for the part where the plurality of solar balls 10 are present. The upper half of the plurality of solar balls 10 protrudes beyond the surface cover layer 23. A metal reflective film 28 is formed on the lower surface of the base panel 21 in order to prevent light from being transmitted to the underside of the solar panel 20. The reflective film 28 is not essential, though, and may be omitted.

With this solar panel 20, the light received by the solar cell 1 is condensed by the outer shell member 11 provided to each of the solar balls 10, so each solar cell 1 receives light over a greater area. Accordingly, each solar cell 1 generates more electricity, the utilization factor of the solar cell 1 is higher, and the solar cells 1 can be arrayed at a greater pitch, which means that fewer solar cells 1 are required. Since the upper surface of each of the solar balls 10 is hemispherical in the solar panel 20, light coming from all directions in three-dimensional space can be guided to the spherical solar cells 1, so there is no decrease in power generating performance if the direction of light incidence should change.

If we assume that the solar balls 10 are arrayed in ten rows and five columns in the solar panel 20, for instance, then an equivalent circuit of this solar panel 20 is as shown in FIG. 10, and the current generated as photovoltaic power by the 50 solar balls 10 flows from the positive electrode terminal 26 to an external circuit.

Since the solar balls 10 in each row are connected in parallel, and the solar balls 10 in each column are connected in series with this solar panel 20, even if there should be a decrease in or a halt to function due to shade or malfunctioning of any of the solar balls 10, just the photovoltaic power from these solar balls 10 will decrease or come to a stop, and the output of the properly functioning solar balls 10 will be diverted through the other solar balls 10 connected in parallel, so there will be almost no adverse effect resulting from a malfunction or decrease in function of some of the solar cells 1, the result being that the solar panel 20 has excellent reliability and durability.

As shown in FIG. 11, it is preferable here to provide an anti-reverse current diode 29 near the negative electrode terminal 27. Specifically, when this solar panel 20 is connected to a battery, there is the danger that the solar panel 20 will be damaged if current reverses from the battery while the solar panel 20 is shut down at night, so the flow of reverse current is prevented by the anti-reverse current diode 29.

Next, a modification of the solar ball 10 will be described.

Figure 12:
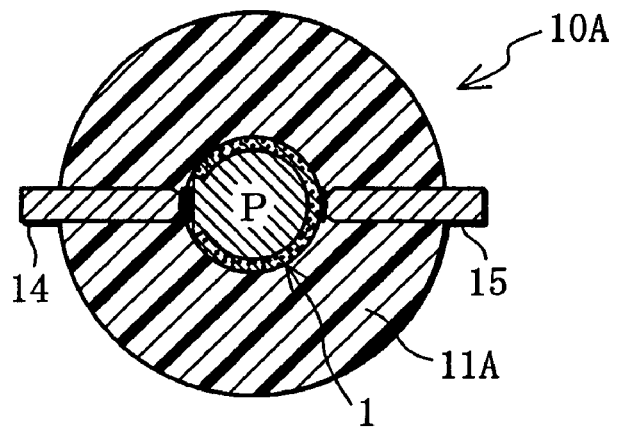
FIG. 12 is an enlarged cross section of the solar ball pertaining to a modification example.
Figure 13:
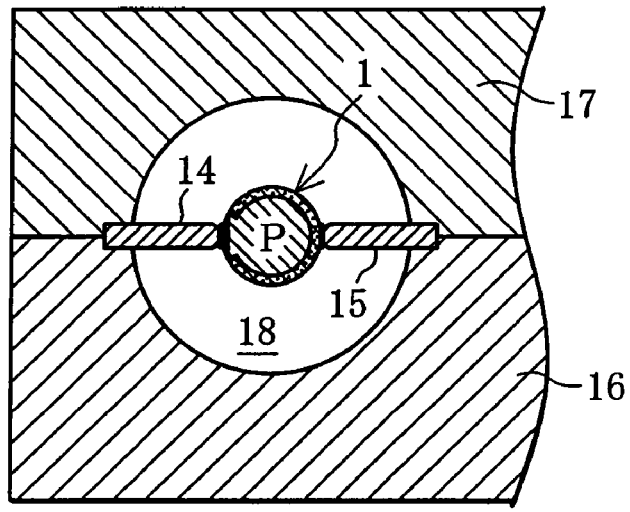
FIG. 13 is an enlarged cross section of the mold used to form the solar ball of FIG. 12, a spherical solar cell, and a pair of electrode members.

With the solar ball 10A shown in FIG. 12, an outer shell member 11A composed of a kind of filler is provided instead of the outer shell member 11 discussed above. When this solar ball 10A is produced, as shown in FIG. 13, the pair of electrode members 14, 15 connected to the solar cell 1 are placed in molds 16, 17, a light-transmitting, insulating, molten synthetic resin (such as a polycarbonate or acrylic) is cast into a cavity 18 within the molds 16, 17 and cured, which produces the solar ball 10A. It is preferable, though, for microscopic light-scattering irregularities similar to the those in FIG. 4 to be formed on the outer surface of the solar ball 10A.

Next, another modification of the solar ball will be described.

Figure 14:
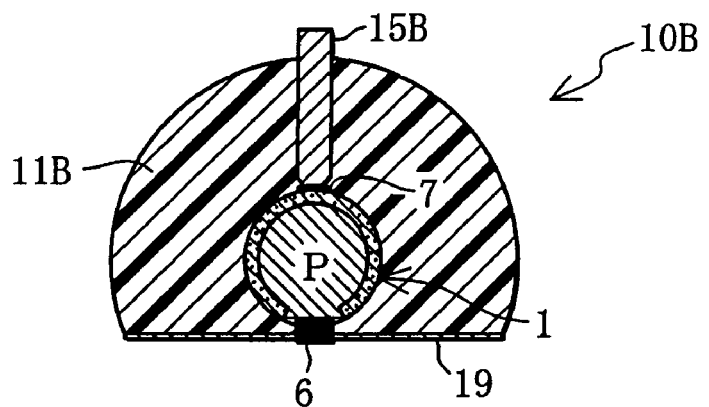
FIG. 14 is an enlarged cross section of the solar ball pertaining to another modification example.

With the solar ball 10B shown in FIG. 14, an outer shell member 11B is formed in the shape of a partial sphere such that approximately the lower third of the sphere is removed. The upper surface of the outer shell member 11B is formed as a partial sphere, while the bottom of the outer shell member 11B is formed flat. The outer shell member 11B is made up of a light-transmitting, insulating synthetic resin material. The solar cell 1 is located at the center of the sphere of the outer shell member 11B, the negative electrode 7 and the positive electrode 6 are oriented up and down, respectively, the positive electrode 6 protrudes slightly from the bottom, and an electrode member 15B connected to the negative electrode 7 passes through the outer shell member 11B and protrudes from the outer surface thereof. A metal reflective film 19 is formed on the bottom of the outer shell member 11B, divided by the positive electrode 6.

The performance of this solar ball 10B in terms of receiving light incident from above is comparable to that of the solar balls 10, 10A, and since the reflective film 19 is formed, less light is transmitted to below. The material expense is lower because less material is needed for the outer shell member 11B.

Figure 15:
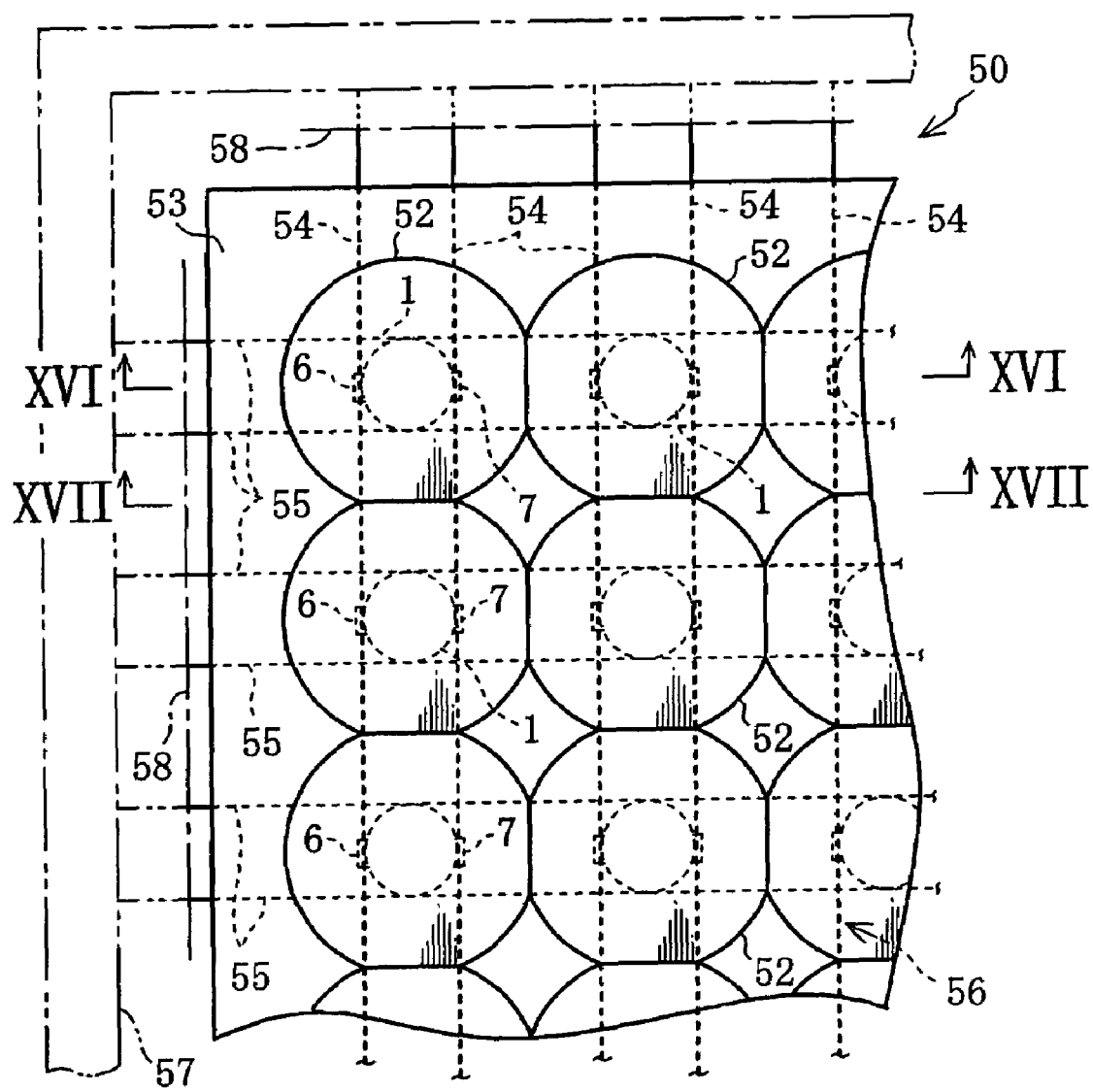
FIGS. 15 to 17 are diagrams related to the solar panel according to another embodiment, with FIG. 15 being a detail enlarged plan view of the solar panel, FIG. 16 a cross section along the XVI—XVI line in FIG. 15, and FIG. 17 a cross section along the XVII—XVII line in FIG. 15.
Figure 16:
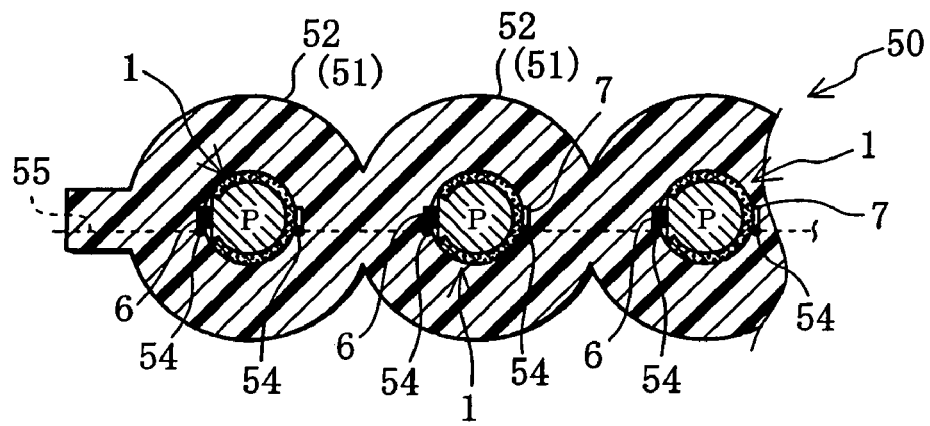
Figure 17:
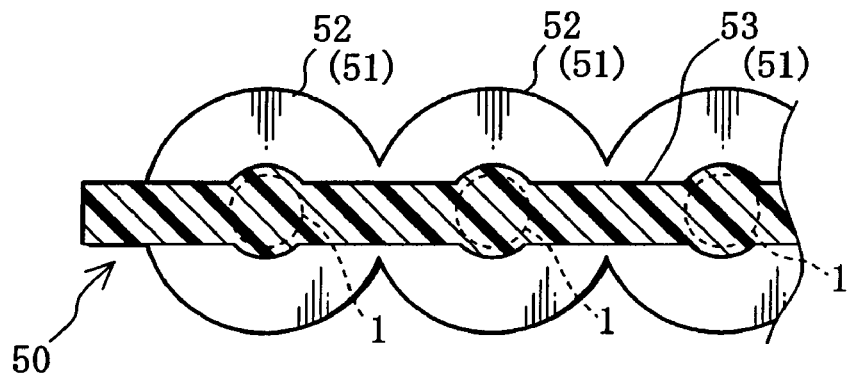

Other Embodiment 1 (See FIGS. 15 to 17)

Next, descriptions will be made on another embodiment of a solar panel 50 in which many of the solar cells 1 are incorporated. This solar panel 50 corresponds to a semiconductor apparatus. With the solar panel 50 shown in FIGS. 15 to 17, a plurality of spherical solar cells 1 are arrayed in a matrix of a plurality of rows and a plurality of columns, a conduction connection mechanism is provided for electrically connecting in parallel the plurality of solar cells 1 in each row or column, and there is provided an outer shell member 51 comprising a plurality of substantially spherical outer shell components 52 that cover the plurality of solar cells 1, and a flat component 53 formed integrally with the plurality of outer shell components 52.

The solar cells 1 are located at the center of the outer shell components 52, the outer shell components 52 cover the outer surface of the solar cells 1 with a light-transmitting wall component, and each of the outer shell components 52 is formed integrally with its adjacent outer shell components 52. The thickness of the light-transmitting wall component of the outer shell components 52 is preferably at least ¼ the diameter of the solar cell 1. The outer shell components 52 have the same function as the outer shell member 11 of the solar ball 10.

The conduction connection mechanism comprises a plurality of conduction wires 54, which are part of a network structure 56 made up of these conduction wires 54 and a plurality of insulator wires 55 disposed perpendicular to the conduction wires 54. In this network structure 56, the pairs of conduction wires 54 along a column of solar cells 1 are provided at a spacing equal to the diameter of the solar cells 1, and the pairs of insulator wires 55 along a row of solar cells 1 are provided at a spacing equal to the diameter of the solar cells 1.

When this solar panel 50 is produced, the first step is to ready a plurality of solar cells 1 and the network structure 56 whose outer periphery is supported by a rectangular frame 57, and dispose the plurality of solar cells 1 on this network structure 56 as shown in FIG. 15. The positive electrodes 6 of the solar cells 1 are installed facing to the left as viewed in FIG. 15, and the negative electrodes 7 to the right as viewed in FIG. 15. In this case, since the solar cells 1 can be fitted into the squares of the network structure 56 and fixed, many solar cells 1 can be simply and efficiently mounted on the network structure 56.

Next, the positive electrodes 6 of the solar cells 1 are connected by solder or an electroconductive adhesive to the corresponding conduction wires 54, and the negative electrodes 7 of the solar cells 1 are connected by solder or an electroconductive adhesive to the corresponding conduction wires 54. The network structure 56 to which these many solar cells 1 have been mounted is then placed in a specific mold of an injection molding apparatus, a melt of a light-transmitting, insulating synthetic resin (such as a polycarbonate or acrylic) is injected into the molding cavity of this mold, and the solar panel 50 shown in FIGS. 15 to 17 is molded. After this molding, the molded article is taken out of the mold, and the outer periphery of the network structure 56 is cut where indicated by the dashed lines 58 and separated from the frame 57, resulting in the state shown in FIG. 15.

With this solar panel 50, the plurality of solar cells 1 in each column are connected in parallel by a conduction connection mechanism consisting of a pair of conduction wires 54, and the output voltage of the solar cells 1 in each column is 0.5 to 0.6 V. To raise the output voltage of the solar panel 50, a plurality of columns of solar cells 1 can be connected in series via the conduction wires 54 protruding to the outer periphery, in which case the equivalent circuit of this solar panel 50 will be the same as the circuit shown in FIG. 10. One or more diodes for preventing reverse current may be provided as shown in FIG. 11.

Basically the same action is obtained with this solar panel 50 as with the solar panel 20 described above. Also, because the structure is vertically symmetrical, so that light can be received equally from above and below, this configuration makes it possible to construct a solar panel that is applied to window glass, or a solar panel that is used in place of window glass. If only light incident from the top side is to be received by the solar panel 50, though, a reflective film may be formed by plating or another such method on the bottom side of the solar panel 50.

Furthermore, with this solar panel 50, rather than first readying many of the solar balls 10 and then assembling them into a panel, a panel is assembled from a multiplicity of solar cells 1 using the network structure 56, after which the solar panel 50 is created by injection molding, so production entails fewer steps and the cost of production is reduced. It is also possible for the outer shell member 51 to consist of transparent glass.

Other Embodiment 2 (See FIGS. 18 to 21)

Next, descriptions will be made on a solar panel 60 in which many of the solar cells 1 are incorporated into a solar string 61, and these are assembled into panel form. This solar string 61 corresponds to a semiconductor apparatus, and this solar panel 60 also corresponds to a semiconductor apparatus.

Figure 18:
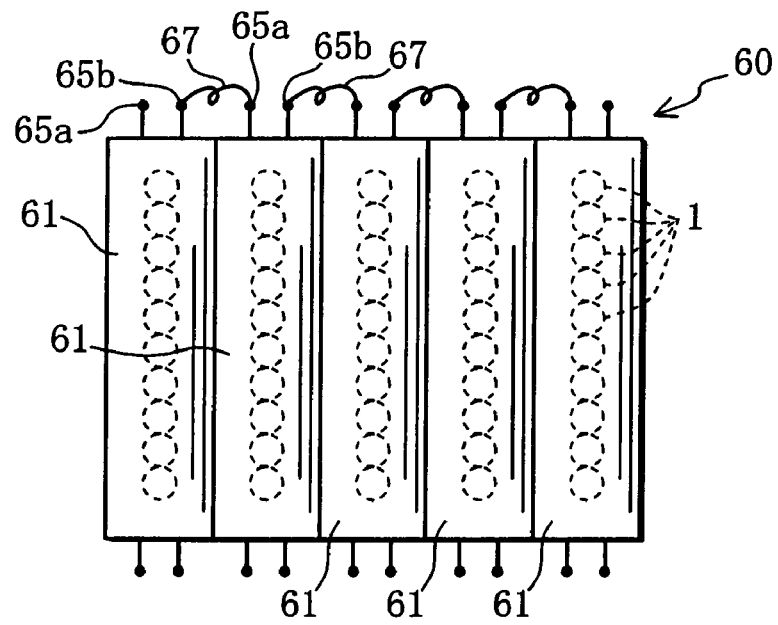
FIGS. 18 to 21 are diagrams, related to the solar panel and solar string pertaining to another embodiment, with FIG. 18 being a plan view of the solar panel, FIG. 19 a side view of the case, FIG. 20 an enlarged cross section of the solar string, and FIG. 21 a cross section along the XXI—XXI line in FIG. 20.
Figure 19:
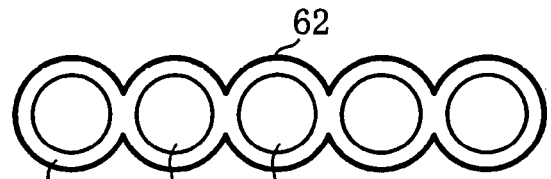
Figure 20:
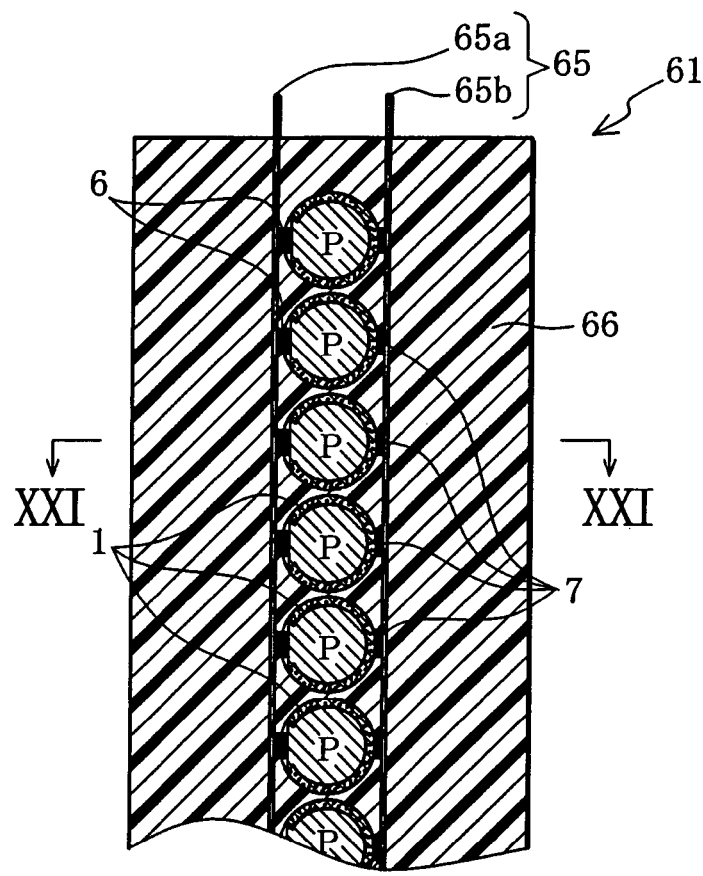
Figure 21:
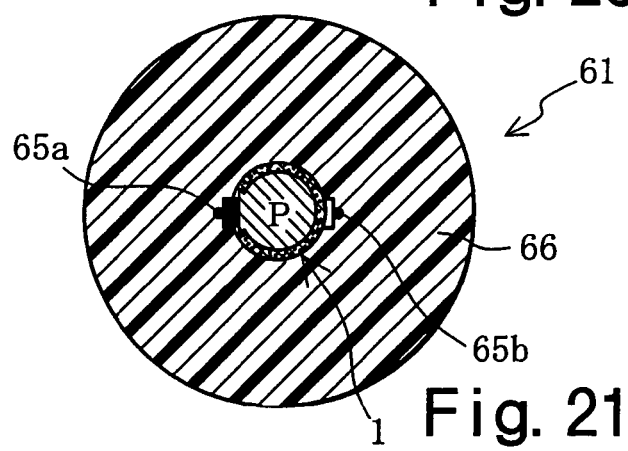

As shown in FIGS. 18 and 19, the solar panel 60 comprises a case 62 made of a transparent synthetic resin, and five (for example) solar strings 61 housed in this case 62. The case 62 consists of five integrally-molded, substantially cylindrical string holders 63 capable of holding the solar strings 61, and a flange 64 is formed at the lower end of each of the string holders 63. As shown in FIGS. 20, 21, the solar strings 61 have a plurality of spherical solar cells 1 arranged in a column, a conduction connection mechanism 65 for connecting these solar cells 1 in parallel, and an outer shell member 66 that has a cylindrical outer surface and covers all of the outside of the plurality of solar cells 1 with a light-transmitting wall component whose thickness is at least ¼ the diameter of a solar cell 1.

The solar cells 1 are the same as those described in the above embodiments. A plurality of the solar cells 1 are disposed with their direction of conductivity aligned, with the positive electrodes 6 facing to the left in FIG. 20 and the negative electrodes 7 facing to the right in FIG. 20, and so that there is a slight gap left between adjacent solar cells 1. The conduction connection mechanism 65 is mainly constituted by a pair of slender, metal conduction wires 65a, 65b.

These conduction wires 65a, 65b are made of, for example, copper, aluminum, nickel, a silver alloy, or a gold alloy. The positive electrodes 6 of a plurality of solar cells 1 are connected by solder or an electroconductive adhesive to the conduction wire 65a, while the negative electrodes 7 of a plurality of solar cells 1 are connected by solder or an electroconductive adhesive to the conduction wire 65b. These solar cells 1 and the conduction connection mechanism 65 are covered by the transparent outer shell member 66. The outer shell member 66 is made of a transparent, insulating synthetic resin (such as a polycarbonate, polyarylate, methacrylic, silicone, or polyester), but may be made of a hard synthetic resin, or of a soft, flexible synthetic resin. One end of the conduction wires 65a, 65b protrudes by a specific length from the outer shell member 66, and power can be taken off to the outside from these protruding ends.

These solar strings 61 are formed in the same length as the case 62, and as shown in FIG. 18, five of the solar strings 61 are housed in the five string holders 63 of the case 62. The five solar strings 61 can be serially connected by connecting with external leads 67 as shown in FIG. 18. In this case, if the photovoltaic power of the solar strings 61 is assumed to be about 0.6 V, then the solar panel 60 shown in FIG. 18 can generate a photovoltaic power of about 3.0 V.

With this solar panel 60, the outer surface of the outer shell member 66 is cylindrical rather than spherical, but more or less just as with the outer shell member 11 discussed above, light coming from various directions is easily guided toward the spherical solar cells 1, which increases the amount of light received, so each solar cell 1 receives light over a greater area. The case 62 is not essential, and the five solar strings 61 may instead be aligned and bonded together, or sandwiched between a pair of transparent panels.

Additional description will be given at this point for another example of the usage of the solar strings 61. The solar strings 61 can also be used in configurations other than that of the solar panel 60. For instance, if the solar strings 61 are to be used as the power supply for a mobile electronic device, they can be incorporated into necklaces, broaches, wristbands, handbags, belts, hats, eyeglasses, or other such personal accessories, or part of such accessories.

In this case, if the outer shell member 66 is made from a soft, flexible synthetic resin as needed, the result will be flexible solar strings 61. It is also possible for a plurality of the solar strings 61 to be arranged serially or in a linked form so that they are electrically connected in series.

With the solar strings 61, since a plurality of solar cells 1 are connected in parallel, the voltage of the photovoltaic power of each of the solar strings 61 is substantially constant (0.5 to 0.6 V), and therefore a photovoltaic power of about 3.0 V can be generated by connecting five or six of the solar strings 61 in series, and a photovoltaic power of the desired voltage can be generated by suitably selecting the number of solar strings 61 to be serially connected. Furthermore, while only very little current is generated by each individual solar cell 1, a current corresponding to the number of solar cells 1 incorporated into the solar strings 61 can be generated, affording excellent versatility.

The structure of the solar strings 61 is not limited to what is shown in the drawings, and may instead be, for example, a structure in which a large spacing is set between the solar cells 1, and the outside of each solar cell 1 is covered with a spherical outer shell member or a substantially spherical outer shell member. A structure such as a network in which solar strings are combined longitudinally and laterally may also be employed.

Figure 22:
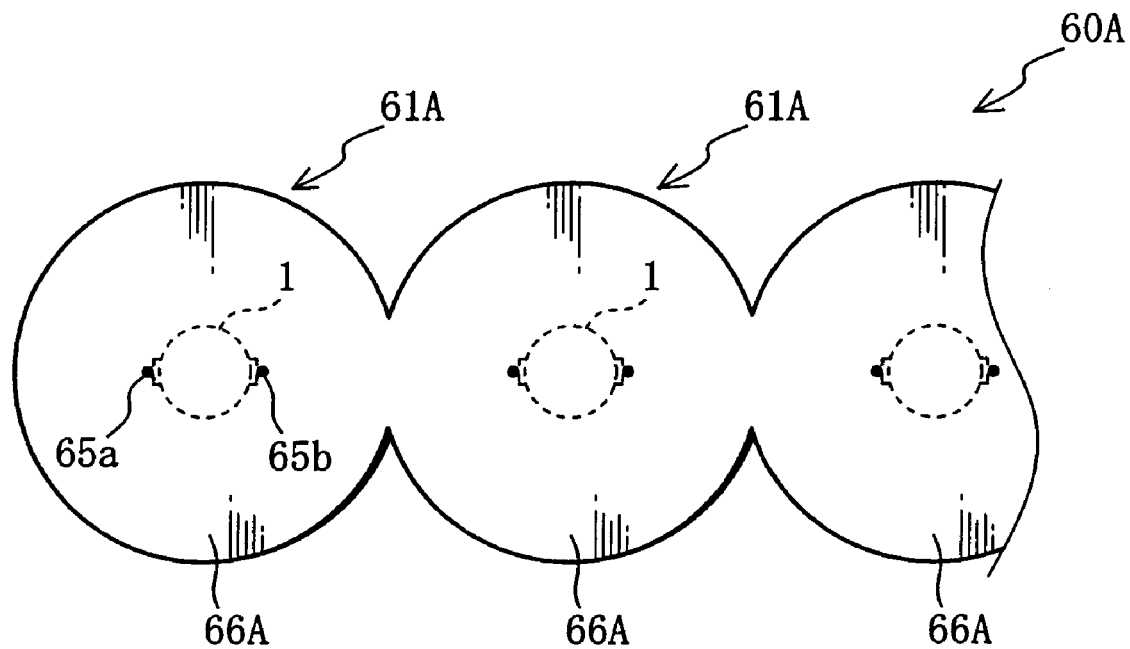
FIG. 22 is a detail enlarged side view of the solar panel pertaining to a modification example.

As an example of a solar panel in which the solar strings 61 are aligned, as shown in FIG. 22, the outer shell members 66A (corresponding to cylindrical components) of a plurality of solar strings 61A can be integrally structured to configure a solar panel 60A.

Next, various examples of modifying the above embodiments and modifications will be described.

1) In the solar cell 1, a spherical crystal composed of an n type silicon monocrystal may be employed in place of the spherical crystal 2 composed of a p type silicon monocrystal, and a p type diffusion layer may be formed instead of the n type diffusion layer 4. In this case the positive electrode 6 and the negative electrode 7 are reversed.

Also, the flat surface 3 and a flat surface that is located on the opposite side from this flat surface 3, is parallel to the flat surface 3, and is of a different size from that of the flat surface 3 may be formed on the spherical crystal 2, and the negative electrode 7 may be provided on this flat surface. These flat surfaces are not essential, however, and can be omitted.

Also, in place of the spherical crystal 2, a spherical crystal may be employed which has in its interior a spherical core made of an insulating material, and in which the outer surface of this core is covered with a semiconductor monocrystal.

2) A ceramic wiring substrate, a metal wiring glass substrate, or a sheet composed of a transparent synthetic resin may be employed instead of the printed substrate in the solar panel 30. Also, the solar cells 1 can be electrically connected by wire bonding in the solar panel 30.

3) In the above embodiments, examples of a light-receiving semiconductor apparatus such as a solar ball, solar panel, or solar string were described, but the present invention can be similarly applied to a light-emitting ball, light-emitting panel, light-emitting string, or other such light-emitting semiconductor apparatus. In the case of this light-emitting semiconductor apparatus, a semiconductor apparatus that emits light from a ball, a semiconductor apparatus that emits light in planar fashion from a panel, or a semiconductor apparatus that emits light from a string can be produced by incorporating a granular light emitting diode (LED) that emits light through electro-optical conversion instead of the spherical solar cell 1 discussed above. The spherical light emitting diode proposed by the inventors of the present invention in U.S. Pat. No. 6,204,545, or a spherical light emitting diode with a similar structure, can also be employed as this light emitting diode.

An example of a spherical light emitting diode with a quantum well structure will now be described.

Figure 23:
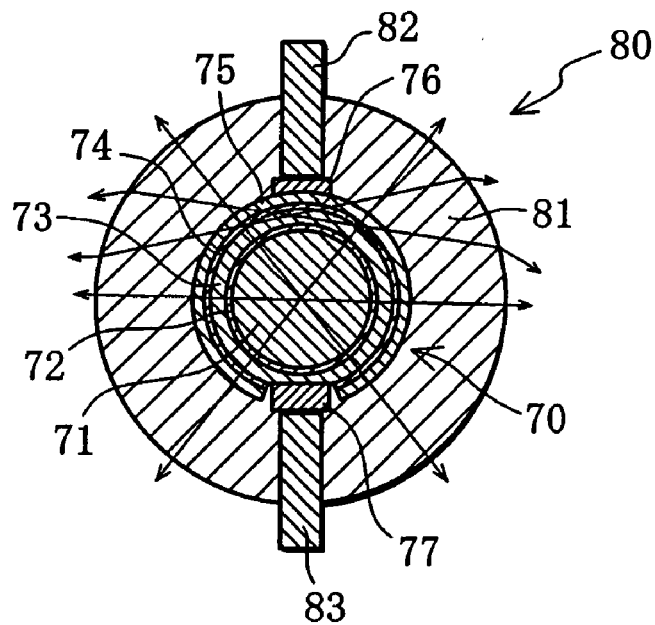
FIG. 23 is an enlarged cross section of a light emitting ball pertaining to another embodiment.

The spherical light emitting diode 70 (corresponds to a spherical semiconductor device) shown in FIG. 23 comprises a transparent spherical sapphire 71 (with a diameter of 0.6 to 5.0 mm, for example), a buffer layer 72 composed of spherical GaN (gallium nitride) formed as a thin film on the surface of this spherical sapphire 71, a spherical n type GaN layer 73 formed as a thin film on the surface of this buffer layer 72, a light emitting layer 74 composed of spherical InGaN (indium gallium nitride) formed as a thin film on the surface of this n type GaN layer 73, a spherical p type GaN layer 75 formed as a thin film on the surface of this light emitting layer 74, a pair of electrodes 76, 77 (anode 76 and cathode 77), and so forth. The buffer layer 72 and light emitting layer 74 can be formed on the surface of the spherical sapphire 71 by a known process such as MOCVD.

The anode 76 and cathode 77 are provided so as to be aligned in a straight line on either side of the center of the spherical light emitting diode 70, and are positioned at the two ends of the spherical light emitting diode 70. The anode 76, which consists of an ohmic contact, is connected to the p type GaN layer 75, while the cathode 77, which also consists of an ohmic contact, is connected to the n type GaN layer 73. With this light emitting diode 70, when current flows forward from the anode 76 to the cathode 77, light is generated at a wavelength corresponding to the material of the light emitting layer 74 from near the pn junction, and radiates to the outside.

When the material forming the light emitting layer 74 is $In_xGa_{1-x}N$, the light is emitted at a longer wavelength as the amount of indium x is increased. For instance, if x=0.2, blue light with a wavelength $\lambda$ p of 465 nm is emitted, and when x=0.45, green light with a wavelength $\lambda$ p of 520 nm is emitted. A light emitting ball 80 (corresponds to a light-emitting semiconductor apparatus) comprises the spherical light emitting diode 70, an outer shell member 81 that covers the outside of this spherical light emitting diode 70 with a light-transmitting wall component whose thickness is at least ¼ the diameter of the spherical light emitting diode 70, with the outer surface of this outer shell member 81 being spherical or partially spherical, a pair of electrode members 82, 83 (external leads) connected to the pair of electrodes 76, 77 and protruding to outside the outer surface of the outer shell member 81. The electrode member 82 is connected to the positive electrode 76 by an electroconductive adhesive, while the electrode member 83 is connected to the negative electrode 77 by an electroconductive adhesive. The outer shell member 81 is made of a transparent, insulating synthetic resin (such as an epoxy resin). The light generated from the light emitting layer 74 of the spherical light emitting diode 70 (indicated by the arrows in the drawings), including the light passing through the spherical sapphire 71, radiates in all directions, as shown in the drawings. Here, since the light generated by the spherical light emitting diode 70 radiates from the entire surface of the outer shell member 81, the light emitting source is larger, the brightness of the light radiated from this source is decreased, and a softer light is radiated. A diffusion agent (such as glass powder) may be added to the outer shell member 81 for diffusing the light as needed. The light emitting ball 80 may be used as a single light emitting device, but the spherical light emitting diode 70 or the light emitting ball 80 can also be constituted as a light emitting panel such as the solar panels 20, 50, 60 discussed above, or can be constituted as a light emitting string such as the solar string 61. In some cases, a reflective film may be provided to one side of the light emitting ball 80, the light emitting panel, or the light emitting string so that light is only emitted from the side opposite from this side. Also, the spherical light emitting diode 70 is just one example, and can instead be a light emitting diode that emits red light, or one that emits white light, or one that emits any of various other colors of light.

A spherical GaN crystal may be employed instead of the spherical sapphire 71, in which case the GaN buffer layer 72 can be omitted.

4) The spherical solar cell 1 described above was an example of a light-emitting semiconductor cell produced from a silicon semiconductor, but it can also be made from any other light-receiving semiconductor cell with an photoelectrical conversion function, such as SiGe, GaAs and compounds thereof, InP and compounds thereof, CuInSe2 and compounds thereof, and CdTe and compounds thereof.

Alternatively, when a light-emitting semiconductor module is made by incorporating light-emitting semiconductor cells, light-emitting semiconductor cells with an electro-optical conversion function can be made from semiconductors such as GaAs and compounds thereof, InP and compounds thereof, GaP and compounds thereof, GaN and compounds thereof, and SiC and compounds thereof.

The invention claimed is:

1. A light-receiving or light-emitting semiconductor apparatus, comprising:
at least one spherical semiconductor device with a light-receiving function or a light-emitting function,
the spherical semiconductor device comprising:
a p or n type semiconductor crystal with a spherical outer shape;
a pn junction formed substantially spherically on the surface layer of the semiconductor crystal; and
a pair of electrodes connected to both ends of the pn junction and located on either side with interposing the center of curvature or the pn junction therebetween;
an outer shell member covering an outside of the spherical semiconductor device with a light-transmitting wall component, the outer shell member having a thickness of at least ¼ the diameter of the spherical semiconductor device so that the outer surface of the outer shell member forms a sherical shape; and
the outer shell member comprising a light-transmitting capsule forming the outer surface of the outer shell member, and a filler comprising a light-transmitting synthetic resin, said resin being packed into the capsule and cured.

2. A light-receiving or light-emitting semiconductor apparatus, comprising:
at least one spherical semiconductor device with a light-receiving function or a light-emitting function,
the spherical semiconductor device comprises:
a p or n type semiconductor crystal with a spherical outer shape;
a pn junction formed substantially spherically on the surface layer of the semiconductor crystal; and
a pair of electrodes connected to both ends of the pn junction and located on either side with interposing the center of curvature of the pn junction therebetween,
an outer shell member covering an outside of the spherical semiconductor device with a light-transmitting wall component, the outer shell member having a thickness of at least ¼ the diameter of the spherical semiconductor device so that the outer surface of the outer shell member forms a sphere or partial sphere; and
a pair of electrode members respectively connected to the pair of electrodes of the spherical semiconductor device and extending through the outer shell member at least to the outer surface of the outer shell member.

3. The semiconductor apparatus of claim 2, wherein a plurality of microscopic light scattering surfaces are formed on the outer surface of the outer shell member.

4. The semiconductor apparatus of claim 2, wherein:
the outer surface of the outer shell member is a sphere; and
the outer shell member comprises a light-transmitting capsule forming the outer surface of the outer shell member, and a filler comprising a light-transmitting synthetic resin, said resin being packed into the capsule and cured.

5. A light-receiving or light-emitting semiconductor apparatus, comprising:
a plurality of spherical semiconductor devices with a light-receiving function or a light-emitting function,
at least one of the spherical semiconductor devices comprising:
a p or n type semiconductor crystal with a spherical outer shape;
a pn junction formed substantially spherically on the surface layer of the semiconductor crystal; and
a pair of electrodes connected to both ends of the pn junction and located on either side with interposing the center of curvature of the pn junction therebetween, and
an outer shell member covering an outside of the at least one spherical semiconductor device with a light-transmitting wall component, the outer shell member having a thickness of at least ¼ the diameter of the at least one spherical semiconductor device so that the outer surface of the outer shell member forms a spherical shape
said plurality of semiconductor devices being arrayed in a matrix of a plurality of rows and a plurality of columns;
a serial connection mechanism electrically connecting in series the plurality of spherical semiconductor devices in each row or column; and
a parallel connection mechanism for electrically connecting in parallel the plurality of spherical semiconductor devices in each column or row.

6. The semiconductor apparatus of claim 5, wherein the outer surface of the outer shell member is a sphere; and
the outer shell member comprises a light-transmitting capsule forming the outer surface of the outer shell member, and a filler comprising a light-transmitting synthetic resin, said resin being packed into the capsule and cured.

7. The semiconductor apparatus of claim 5, wherein a plurality of microscopic light scattering surfaces are formed on the outer surface of the outer shell member.

8. A light-receiving or light-emitting semiconductor apparatus, comprising:
a plurality of spherical semiconductor devices with a light-receiving function or a light-emitting function,
at least one of the plurality of spherical semiconductor devices comprising:
a p or n type semiconductor crystal with a spherical outer shape;
a pn junction formed substantially spherically on the surface layer of the semiconductor crystal; and
a pair of electrodes connected to both ends of the pn junction and located on either side with interposing the center of curvature of the pn junction therebetween, and
an outer shell member covering an outside of the at least one spherical semiconductor device with a light-transmitting wall component, the outer shell member having a thickness of at least ¼ the diameter of the at least one spherical semiconductor device so that the outer surface of the outer shell member forms a sphere or partial sphere;
the plurality of spherical semiconductor devices being arrayed in a matrix of a plurality of rows and a plurality of columns;
a conduction connection mechanism electrically connecting in parallel the plurality of spherical semiconductor devices in each row or column; and
the outer shell member comprising a plurality of substantially spherical outer shell components covering respectively the plurality of spherical semiconductor devices, and a flat component formed integrally with the plurality of outer shell components.

9. The light-receiving or light-emitting semiconductor apparatus according to claim 8, wherein the conduction connection mechanism comprises a plurality of conductor wires, which are part of a network structure constituted by the plurality of conductor wires and a plurality of insulator wires laid out perpendicularly to these conductor wires.

10. A light-receiving or light-emitting semiconductor apparatus comprising:
- a plurality of spherical semiconductor devices including a light-receiving function or a light-emitting function, said plurality of semiconductors being disposed in a single column;
- each of the spherical semiconductor devices including a p or an n type semiconductor crystal, said crystal having a spherical outer shape;
- a pn junction being formed substantially spherically on the semiconductor crystal; and
- a pair of electrodes being connected to both ends of the pn junction and being located on either side of the pn junction, the pair of electrodes interposing a center of curvature of the pn junction therebetween;
- a conduction connection mechanism electrically connecting in parallel the plurality of spherical semiconductor devices disposed in the single column;
- an outer shell member having a cylindrical outer surface and commonly covering the plurality of spherical semiconductor devices; and
- said outer shell member including a light-transmitting wall component, said wall component having a thickness of at least ¼ the diameter of the spherical semiconductor devices.

11. A light-receiving or light-emitting semiconductor apparatus comprising:
- a plurality of spherical semiconductor devices including a light-receiving function or a light-emitting function;
- the plurality of spherical semiconductor devices being disposed in a plurality of columns;
- each of the spherical semiconductor devices comprising a p or an n type semiconductor crystal, said crystal having a spherical outer shape;
- a pn junction being formed substantially spherically on the semiconductor crystal;
- a pair of electrodes being connected to both ends of the pn junction and being disposed on either side of the pn junction, the pair of electrodes interposing a center of curvature of the pn junction therebetween;
- a conduction connection mechanism electrically connecting in parallel the spherical semiconductor devices in the columns;
- an outer shell member commonly covering the spherical semiconductor devices with a light-transmitting wall component, said wall component having a thickness of at least approximately equal to the diameter of the spherical semiconductor devices; and
- the outer shell member including a plurality of substantially cylindrically shaped members covering respectively the columns of spherical semiconductor devices.

* * * * *